United States Patent
Mizuguchi et al.

(10) Patent No.: US 9,081,278 B2
(45) Date of Patent: Jul. 14, 2015

(54) PHOTOSENSITIVE CONDUCTIVE PASTE AND METHOD OF PRODUCING CONDUCTIVE PATTERN

(71) Applicant: Toray Industries, Inc., Tokyo (JP)

(72) Inventors: Tsukuru Mizuguchi, Otsu (JP); Satoshi Matsuba, Nagoya (JP); Kazutaka Kusano, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 14/386,497

(22) PCT Filed: Mar. 4, 2013

(86) PCT No.: PCT/JP2013/055808
§ 371 (c)(1),
(2) Date: Sep. 19, 2014

(87) PCT Pub. No.: WO2013/141009
PCT Pub. Date: Sep. 26, 2013

(65) Prior Publication Data
US 2015/0050586 A1    Feb. 19, 2015

(30) Foreign Application Priority Data

Mar. 22, 2012   (JP) .................. 2012-064946

(51) Int. Cl.
| | | |
|---|---|---|
| H01B 1/22 | (2006.01) | |
| G03F 7/038 | (2006.01) | |
| G03F 7/027 | (2006.01) | |
| G03F 7/40 | (2006.01) | |
| G06F 3/044 | (2006.01) | |

(52) U.S. Cl.
CPC .............. *G03F 7/0388* (2013.01); *G03F 7/027* (2013.01); *G03F 7/038* (2013.01); *G03F 7/40* (2013.01); *G06F 3/044* (2013.01); *H01B 1/22* (2013.01)

(58) Field of Classification Search
CPC .......... G03F 7/0388; G03F 7/40; G06F 3/044
USPC ............. 430/18, 330, 270.1, 287.1, 319, 321, 430/285.1, 280.1
See application file for complete search history.

(56) References Cited

U.S. PATENT DOCUMENTS

| | | | | |
|---|---|---|---|---|
| 6,214,527 | B1 * | 4/2001 | Kosaka et al. ................ | 430/319 |
| 6,309,502 | B1 * | 10/2001 | Hiroshige et al. .......... | 156/273.3 |
| 2005/0188788 | A1 | 9/2005 | Ogi et al. | |
| 2006/0029882 | A1 | 2/2006 | Yang et al. | |
| 2008/0118865 | A1 * | 5/2008 | Sasaki et al. ................ | 430/270.1 |

FOREIGN PATENT DOCUMENTS

| | | |
|---|---|---|
| JP | 02-206675 | 8/1990 |
| JP | 10-064333 | 3/1998 |
| JP | 2004-361352 | 12/2004 |
| JP | 2005-240092 | 9/2005 |
| JP | 2007-207567 | 8/2007 |
| JP | 2008-509439 | 3/2008 |
| JP | 2008-176312 | 7/2008 |
| JP | 2009-237245 | 10/2009 |
| JP | 2011-186019 | 9/2011 |
| WO | 2004/061006 | 7/2004 |
| WO | 2012/124438 | 9/2012 |

* cited by examiner

*Primary Examiner* — John A McPherson
(74) *Attorney, Agent, or Firm* — DLA Piper LLP (US)

(57) ABSTRACT

A photosensitive conductive paste includes a dicarboxylic acid or an acid anhydride thereof (A); a compound (B) having an acid value of 40 to 200 mg KOH/g; an alicyclic compound (C); a photopolymerization initiator (D); and a conductive filler (E).

18 Claims, 1 Drawing Sheet

PHOTOSENSITIVE CONDUCTIVE PASTE AND METHOD OF PRODUCING CONDUCTIVE PATTERN

TECHNICAL FIELD

This disclosure relates to a photosensitive conductive paste and a method of producing a conductive pattern using the photosensitive conductive paste.

BACKGROUND

Conductive pattern refers to a conductive pattern that contains both an organic component including a resin and an inorganic component including a conductive filler or the like.

A so-called polymer-type conductive paste with a large amount of a particulate silver flake or copper powder, or carbon particles mixed in a resin or an adhesive for forming an organic-inorganic composite conductive pattern as described above has come into practical use.

Many of polymer-type conductive pastes put into practical use form a pattern by a screen printing method and heating and curing the pattern to form a conductive pattern (Japanese Patent Laid-open Publication No. 02-206675 and Japanese Patent Laid-open Publication No. 2007-207567).

To accurately draw a pattern of 100 μm or less, a conductive paste capable of being acid-etched (Japanese Patent Laid-open Publication No. 10-64333) and a photosensitive curable conductive paste (Japanese Patent Laid-open Publication No. 2004-361352 and WO 2004/61006) are disclosed.

However, it is difficult to accurately draw a pattern of 100 μm or less by the screen printing methods disclosed Japanese Patent Laid-open Publication No. 02-206675 and Japanese Patent Laid-open Publication No. 2007-207567.

The conductive paste described in Japanese Patent Laid-open Publication No. 10-64333 has the problem that, to perform patterning by a photolithography method, it is necessary to form a resist layer on a coating film, leading to an increase in the number of steps. In the methods described in Japanese Patent Laid-open Publication No. 2004-361352 and WO 2004/61006, a fine pattern is easily obtained by imparting photosensitivity. However, the method in Japanese Patent Laid-open Publication No. 2004-361352 leads to low conductivity, and the method described in WO 2004/61006 requires that the acryl (methacryl) equivalent be reduced to exhibit conductivity so that a conductive pattern obtained using this method is fragile. Hence, it is difficult to apply onto a flexible substrate and poor in adhesion to an ITO (indium tin oxide) electrode on a glass or film base material.

It could therefore be helpful to provide a photosensitive conductive paste capable of forming a conductive pattern having high adhesion to ITO on a base material, can be finely patterned, can exhibit conductivity at a relatively low temperature, and has flexibility if necessary; and a method of producing a conductive pattern.

SUMMARY

We thus provide:

A photosensitive conductive paste including: a dicarboxylic acid or an acid anhydride thereof (A); a compound (B) having an acid value falling within a range of 40 to 200 mg KOH/g; an alicyclic compound (C); a photopolymerization initiator (D); and a conductive filler (E).

A method of producing a conductive pattern, wherein the photosensitive conductive paste is applied onto a substrate, dried, exposed, developed, and then cured at a temperature of 100° C. to 300° C. (inclusive).

In the photosensitive conductive paste, the compound (B) having an acid value falling within a range of 40 to 200 mg KOH/g preferably has an unsaturated double bond.

In the photosensitive conductive paste, the dicarboxylic acid or an acid anhydride thereof (A) is preferably a dicarboxylic acid represented by structural formula (1), or an acid anhydride thereof:

(1)

wherein R represents a divalent organic group with a carbon number of 1 to 30; and n and m each represent an integer of 0 to 3.

In the photosensitive conductive paste of the present invention, the dicarboxylic acid or an acid anhydride thereof (A) is preferably a dicarboxylic acid represented by structural formula (2), or an acid anhydride thereof:

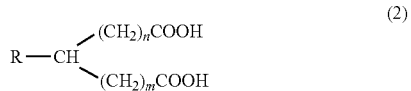

(2)

wherein R represents a divalent organic group with a carbon number of 1 to 30; and n and m each represent an integer of 0 to 3.

In the photosensitive conductive paste, the alicyclic compound (C) preferably contains any one of an unsaturated double bond, a hydroxyl group, a carboxyl group, an epoxy group, an amino group and an isocyanate group.

In the photosensitive conductive paste, the alicyclic compound (C) preferably has a cyclohexane backbone.

In the photosensitive conductive paste, the compound (B) having an acid value falling within 40 to 200 mg KOH/g is preferably an epoxy acrylate.

In the photosensitive conductive paste, the compound (B) having an acid value falling within 40 to 200 mg KOH/g preferably has a glass transition temperature falling within a range of −10 to 50° C.

There is the advantage that a conductive pattern having excellent adhesion to ITO and having a low specific resistivity even under low curing temperature conditions is obtained, and fine patterning is possible owing to high photosensitive characteristics. Preferably, fine bumps, wiring or the like can be easily formed not only on a rigid substrate but also on a flexible substrate.

DESCRIPTION OF REFERENCE SIGNS

Figure 1:
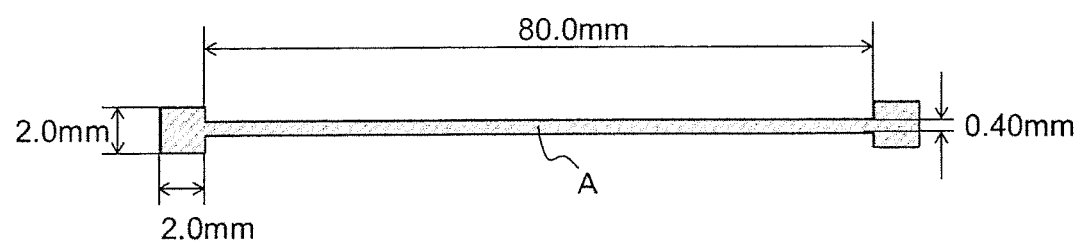
FIG. 1 is a schematic view showing a light transmission pattern of a photomask used in evaluation of the specific resistivity in examples.

A: Light transmission part
B, C: Sample short side
D: Conductive pattern
E: PET film

DETAILED DESCRIPTION

The photosensitive conductive paste is formed by dispersing a conductive filler (E) in a photosensitive resin composition including a dicarboxylic acid or an acid anhydride thereof (A), a compound (B) having an acid value falling within 40 to 200 mg KOH/g, an alicyclic compound (C) and a photopolymerization initiator (D).

The paste is a photosensitive conductive paste that can form a desired conductive pattern on a substrate by passing through steps of applying the paste on the substrate, drying the paste to remove a solvent as necessary, and then subjecting the paste to exposure, development and curing at 100° C. to 300° C. (inclusive). The conductive pattern obtained using the paste is a composite of an organic component and an inorganic component, and conductive fillers come into contact with one another due to setting shrinkage during curing to exhibit conductivity.

Examples of the dicarboxylic acid compound of the dicarboxylic acid and an acid anhydride thereof (A) contained in the photosensitive conductive paste include oxalic acid, malonic acid, succinic acid, glutaric acid, adipic acid, pimelic acid, suberic acid, azelaic acid, sebacic acid, phthalic acid, isophthalic acid and terephthalic acid, and examples of the compound corresponding to the above structural formula (1) include 2-methylmalonic acid, 2-ethylmalonic acid, 2-propylmalonic acid, 2-butylmalonic acid, 2-(3-methoxypropyl)malonic acid, 2-(3-propoxypropyl)malonic acid, 2-(3-propoxybutyl)malonic acid, (E)-2-(hexa-4-ethyl)malonic acid, 2-methylsuccinic acid, 2-ethylsuccinic acid, 2-propylsuccinic acid, 2-butylsuccinic acid, 2-(3-methoxypropyl)succinic acid, 2-(3-propoxypropyl)succinic acid, 2-(3-propoxybutyl)succinic acid, (E)-2-(hexa-4-ethyl)succinic acid, 2-methyldioic acid, 2-ethyldioic acid, 2-propyldioic acid, 2-butyldioic acid, 2-(3-methoxypropyl)dioic acid, 2-(3-propoxypropyl)dioic acid, 2-(3-propoxybutyl)dioic acid, (E)-2-(hexa-4-ethyl)dioic acid, 2-hexylpentanedioic acid, 3-hexylpentanedioic acid, 2-methylmaleic acid, 2-ethylmaleic acid, 2-propylmaleic acid, 2-butylmaleic acid, 2-(3-methoxypropyl)maleic acid, 2-(3-propoxypropyl)maleic acid, 2-(3-propoxybutyl)maleic acid, (E)-2-(hexa-4-ethyl)maleic acid, 2-hexylmalonic acid, 2-(3-ethoxypropyl)succinic acid, 2-(3-ethoxybutyl)succinic acid, (E)-2(hexa-1-enyl)succinic acid, 3-hexylpentanedioic acid and (E)-2-(hexa-4-ethyl)succinic acid. Among them, (E)-2-(hexa-4-ethyl)succinic acid, 2-propylsuccinic acid, 3-hexylpentanedioic acid, 2-hexylmalonic acid, 2-(3-ethoxypropyl)succinic acid, 2-(3-ethoxybutyl)succinic acid and (E)-2(hexa-1-enyl)succinic acid are particularly preferred. The acid anhydride refers to a compound in which two carboxylic acid molecules are dehydration-condensed in the above-described compound.

The added amount of the dicarboxylic acid or an acid anhydride thereof (A) is preferably 0.5 to 30 parts by weight, more preferably 1 to 20 parts by weight based on 100 parts by weight of the compound (B) having an acid value falling within 40 to 200 mg KOH/g. When the added amount of the dicarboxylic acid or an acid anhydride thereof (A) is 0.5 parts by weight or more based on 100 parts by weight of the component (B), the affinity to developer is increased and good patterning can be obtained as well as the conductivity of the final composition is enhanced. When the added amount of the acid anhydride (A) is 30 parts by weight or less, the development margin and adhesion under a high temperature and high humidity can be improved.

The photosensitive compound (B) contained in the photosensitive conductive paste and having an acid value falling within 40 to 200 mg KOH/g refers to a monomer, oligomer or polymer having at least one carboxyl group in the molecule, and one or more kinds thereof can be used.

Specific examples of the compound (B) include acryl-based copolymers. The acryl-based copolymer is a copolymer containing at least an acryl-based monomer as a copolymerization component, and specific examples of the preferred acryl-based monomer include acryl-based monomers such as methyl acrylate, acrylic acid, 2-ethylhexyl acrylate, ethyl methacrylate, n-butyl acrylate, iso-butyl acrylate, iso-propane acrylate, glycidyl acrylate, N-methoxymethylacrylamide, N-ethoxymethylacrylamide, N-n-butoxymethylacrylamide, N-isobutoxymethylacrylamide, butoxytriethylene glycol acrylate, dicyclopentanyl acrylate, dicyclopentenyl acrylate, 2-hydroxyethyl acrylate, isobonyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate and benzylmercaptan acrylate, and those with acrylate of the above-mentioned monomers replaced by methacrylate, styrenes such as styrene, p-methylstyrene, o-methylstyrene, m-methylstyrene, α-methylstyrene, chloromethylstyrene and hydroxymethylstyrene, γ-methacryloxypropyl trimethoxysilane, 1-vinyl-2-pyrrolidone, allylated cyclohexyl diacrylate, 1,4-butanediol diacrylate, 1,3-butyrene glycol diacrylate, ethylene glycol diacrylate, diethylene glycol diacrylate, triethylene glycol diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, and epoxy acrylate monomers such as acrylic acid adducts of ethylene glycol diglycidyl ether having at least one hydroxyl group formed by ring-opening an epoxy group with an unsaturated acid, acrylic acid adducts of diethylene glycol diglycidyl ether, acrylic acid adducts of neopentyl glycol diglycidyl ether, acrylic acid adducts of glycerin diglycidyl ether, acrylic acid adducts of bisphenol A diglycidyl ether, acrylic acid adducts of bisphenol F and acrylic acid adducts of cresol novolac, or compounds with acryl groups of the above-mentioned compounds partially or wholly replaced by methacryl groups although all acryl-based compounds having a carbon-carbon double bond can be used.

Alkali solubility can be imparted to an acryl-based copolymer by using as a monomer an unsaturated acid such as an unsaturated carboxylic acid. Specific examples of the unsaturated acid include acrylic acid, methacrylic acid, itaconic acid, crotonic acid, maleic acid, fumaric acid and vinyl acetate or acid anhydrides thereof. By adding the above-mentioned unsaturated acid to the molecular chain, the acid value of the polymer can be adjusted.

An alkali-soluble polymer having a reactive unsaturated double bond on the side chain can be prepared, the alkali-soluble polymer being obtained by reacting a part of an unsaturated acid in an acryl polymer obtained using as a monomer an unsaturated acid such as the above-mentioned unsaturated carboxylic acid with a compound having both a group reactive with an unsaturated acid and a group having an unsaturated double bond, such as glycidyl (meth)acrylate.

The acid value of the compound (B) contained in the photosensitive conductive paste should be 40 to 200 mg KOH/g from the viewpoint of alkali solubility. When the acid value is less than 40 mg KOH/g, solubility of a soluble part in a developer is reduced, and on the other hand, when the acid value is more than 200 mg KOH/g, the development allowance range cannot be broadened. The acid value is determined in accordance with JIS-K0070 (1992).

The glass transition temperature of the compound (B) contained in the photosensitive conductive paste is preferably −10 to 50° C., more preferably 10 to 40. When Tg is −10° C. or higher, tackiness of the dry film can be suppressed, and when Tg is 10° C. or higher, shape stability particularly to a temperature change is improved. When Tg is 50° C. or lower, flexibility is exhibited at room temperature, and when Tg is 50° C. or lower, internal stress at the time of bending can be relaxed, so that in particular, generation of cracks can be suppressed.

The compound (B) contained in the photosensitive conductive paste is preferably an epoxy acrylate. When the compound (B) is an epoxy acrylate, a hydroxyl group formed by ring-opening an epoxy group with an unsaturated acid interacts with a substrate, so that adhesion can be further improved. The epoxy acrylate refers to a compound in which some of copolymerization components are epoxy acrylate monomers.

While the glass transition temperature of the compound (B) contained in the photosensitive conductive paste can be determined by performing differential scanning calorimeter (DSC) measurement of the photosensitive component, the glass transition temperature can be calculated from the following numerical formula (1) using copolymerization ratios of monomers as copolymerization components and glass transition temperatures of homopolymers of the monomers. The above-mentioned value is used when calculation is possible, and the glass transition temperature is determined from a DSC measurement result when the glass transition temperature of a homopolymer is not known.

$$\frac{1}{Tg} = \frac{W1}{T1} + \frac{W2}{T2} + \frac{W3}{T3} + \cdots \quad (1)$$

wherein, Tg represents a glass transition temperature (unit: K) of a polymer, T1, T2, T3—represent glass transition temperatures (unit: K) of homopolymers of monomer 1, monomer 2, monomer 3—, respectively, and W1, W2, W3—represent weight-based The alicyclic compound (C) contained in the photosensitive conductive paste refers to a compound having in the molecule at least one structure in which carbon atoms unite to form a ring, except an aromatic ring. Examples of the structure in which carbon atoms unite to form a ring, except an aromatic ring, include a cyclopropane backbone, a cyclobutane backbone, a cyclopentane backbone, a cyclohexane backbone, a cyclobutene backbone, a cyclopentene backbone, a cyclohexene backbone, a cyclopropyne backbone, a cyclobutyne backbone, a cyclopentyne backbone, a cyclohexyne backbone and a hydrogenated bisphenol A backbone. Specific examples include hydrogenated bisphenol A, 1,1-cyclobutanedicarboxylic acid, 1,2,3,4-cyclobutanetetracarboxylic acid, 4,4-diamino-dicyclohexylmethane, isophorone diamine, dicyclohexylmethane-4,4'-diisocyanate, trans-4-methylcyclohexyl isocyanate, TAKENATE 600 (1,3-bis(isocyanatemethyl)cyclohexane (trade name; manufactured by Mitsui Chemicals, Incorporated), isophorone di isocyanate, 1,2-epoxycyclohexane, 1-vinyl-3,4-epoxycyclohexane, RIKARESIN DME-100 (1,4-cyclohexanedimethanol diglycidyl ether) (trade name; manufactured by New Japan Chemical Co., Ltd.), RIKARESIN HBE-100 (polymer of 4,4'-isopropylidenedicyclohexanol and (chloromethyl) oxirane) (trade name; manufactured by New Japan Chemical Co., Ltd.), ST-4000D (epoxy resin having hydrogenated bisphenol A as a principal component) (trade name; manufactured by NEW NIPPON STEEL CHEMICAL Co., Ltd.), 1,2:5,6-diepoxycyclooctane, PO adduct diacrylates of hydrogenated bisphenol A, EO adduct dimethacrylates of hydrogenated bisphenol A, PO adduct dimethacrylates of hydrogenated bisphenol A, 2-acryloiloxyethylhexahydrophthalic acid, dimethylol-tricyclodecane diacrylate, cyclohexyl acrylate, cyclohexyl methacrylate, tert-butylcyclohexyl acrylate, tert-butylcyclohexyl methacrylate, isobornyl acrylate, dicyclopentenyl acrylate, dicyclopentenyloxyethyl acrylate, dicyclopentanyl acrylate, dicyclopentenyloxyethyl methacrylate and dicyclopentanyl methacrylate. Among them, those having a cyclohexane backbone that three-dimensionally extends are preferred because of high adhesion to ITO.

The added amount of the alicyclic compound (C) contained in the photosensitive conductive paste is preferably 5 to 200 parts by weight, more preferably 30 to 60 parts by weight based on 100 parts by weight of the compound (B) having an acid value falling within a range of 40 to 200 mg KOH/g. When the added amount of the alicyclic compound (C) is 5 parts by weight or more based on 100 parts by weight of the compound (B) having an acid value falling within 40 to 200 mg KOH/g, adhesion to ITO can be improved. When the added amount of the alicyclic compound (C) is 200 parts by weight or less based on 100 parts by weight of the compound (B) having an acid value falling within 40 to 200 mg KOH/g, development residues can be reduced.

The photopolymerization initiator (D) contained in the photosensitive conductive paste refers to a compound which is decomposed by absorbing light having a short wavelength such as an ultraviolet ray, to generate a radical, or a compound which undergoes a hydrogen extraction reaction to generate a radical. Specific examples include, but are not particularly limited to, 1,2-octanedione, 1-[4-(phenylthio)-2-(O-benzoyloxime)], 2,4,6-trimethylbenzoyl-diphenyl-phosphine oxide, bis(2,4,6-trimethylbenzoyl)-phenyl-phosphine oxide, ethanone, 1-[9-ethyl-6-2(2-methylbenzoyl)-9H-carbazole-3-yl]-1-(O-acetyloxime), benzophenone, methyl o-benzoylbenzoate, 4,4'-bis(dimethylamino)benzophenone, 4,4'-bis (diethylamino)benzophenone, 4,4'-dichlorobenzophenone, 4-benzoyl-4'-methyldiphenylketone, dibenzylketone, fluorenone, 2,2'-diethoxyacetophenone, 2,2-dimethoxy-2-phenylacetophenone, 2-hydroxy-2-methylpropiophenone, p-t-butyldichloroacetophenone, thioxanthone, 2-methylthioxanthone, 2-chlorothioxanthone, 2-isopropylthioxanthone, diethylthioxanthone, benzyl, benzyl dimethyl ketal, benzyl-β-methoxyethyl acetal, benzoin, benzoin methyl ether, benzoin butyl ether, anthraquinone, 2-t-butylanthraquinone, 2-amylanthraquinone, β-chloroanthraquinone, anthrone, benzanthrone, dibenzosuberone, methylene anthrone, 4-azidebenzalacetophenone, 2,6-bis(p-azidebenzylidene)cyclohexanone, 6-bis(p-azidebenzylidene)-4-methylcyclohexanone, 1-phenyl-1,2-butanedione-2-(o-methoxycarbonyl)oxime, 1-phenyl-propanedione-2-(o-ethoxycarbonyl)oxime, 1-phenyl-propanedione-2-(o-benzoyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl-[4-(methylthio)phenyl]-2-morpholino-1-propanone, naphthalenesulfonyl chloride, quinolinesulfonyl chloride, N-phenylthioacridone, 4,4'-azobisisobutyronitrile, diphenyl disulfide, benzothiazole disulfide, triphenylphosphine, camphor quinone, 2,4-diethylthioxanthone, isopropylthioxanthone, carbon tetrabromide, tribromophenylsulfone, benzoyl peroxide, and combinations of photo-reductive pigments such as eosin and methylene blue and reducing agents such as ascorbic acid and triethanolamine.

The added amount of the photopolymerization initiator (D) is preferably 0.05 to 30 parts by weight, more preferably 5 to 20 parts by weight based on 100 parts by weight of the compound (B) having an acid value falling within 40 to 200 mg KOH/g. When the added amount of the photopolymerization initiator (D) is 5 parts by weight or more based on 100 parts by weight of the compound (B), the curing density of an exposed part in particular increases, so that the residual film ratio after development can be increased. When the added amount of the photopolymerization initiator (D) is 20 parts by weight or less based on 100 parts by weight of the compound (B), excessive absorption of light particularly by the photopolymerization initiator (D) at the upper part of a coating film can be suppressed to inhibit the conductive pattern from being reversely tapered to reduce adhesion to a base material.

To the photosensitive conductive paste can be added a sensitizer along with the photopolymerization initiator (D) to improve the sensitivity and expand the range of wavelengths effective for reaction.

Specific examples of the sensitizer include 2,4-diethylthioxanthone, isopropylthioxanthone, 2,3-bis(4-diethylaminobenzal)cyclopentanone, 2,6-bis(4-dimethylaminobenzal) cyclohexanone, 2,6-bis(4-dimethylaminobenzal)-4-methylcyclohexanone, Michler's ketone, 4,4-bis(diethylamino)benzophenone, 4,4-bis(dimethylamino) chalcone, 4,4-bis(diethylamino)chalcone, p-dimethylaminocinnamylideneindanone, p-dimethylaminobenzylideneindanone, 2-(p-dimethylaminophenylvinylene)isonaphthothiazole, 1,3-bis(4-dimethylaminophenylvinylene)isonaphthothiazole, 1,3-bis(4-dimethylaminobenzal)acetone, 1,3-carbonylbis(4-diethylaminobenzal)acetone, 3,3-carbonylbis(7-diethylaminocoumarin), N-phenyl-N-ethylethanolamine, N-phenylethanolamine, N-tolyldiethanolamine, isoamyl dimethylaminobenzoate, isoamyl diethylaminobenzoate, 3-phenyl-5-benzoylthiotetrazole and 1-phenyl-5-ethoxycarbonylthiotetrazole. One or more of these compounds can be used. When the sensitizer is added to the photosensitive conductive paste, the added amount thereof is normally, preferably 0.05 to 10 parts by weight, more preferably 0.1 to 10 parts by weight based on 100 parts by weight of the compound (B) having an acid value falling within 40 to 200 mg KOH/g. When the added amount of the sensitizer is 0.1 part by weight or more based on 100 parts by weight of the compound (B), an effect of improving the light sensitivity is easily exhibited sufficiently, and when the added amount is 10 parts by weight or less based on 100 parts by weight of the compound (B), a situation can be inhibited in which light is excessively absorbed particularly at the upper part of a coating film so that the conductive pattern is reversely tapered to reduce adhesion to a base material.

The conductive fillers (E) contained in the photosensitive conductive paste preferably include at least one of Ag, Au, Cu, Pt, Pb, Sn, Ni, Al, W, Mo, ruthenium oxide, Cr, Ti and indium, and these conductive fillers can be used alone, or as an alloy or a mixed powder. Conductive particles obtained by coating insulating particles or conductive particles with the above-mentioned component can be similarly used. Particularly, Ag, Cu and Au are preferred from the viewpoint of conductivity, and Ag is preferred from the viewpoint of costs and stability.

The volume average particle size of the conductive filler (E) is preferably 0.1 to 10 µm, more preferably 0.5 to 6 µm. When the volume average particle size is 0.1 µm or more, the probability of contact between conductive fillers is improved, the specific resistivity and breakage probability of the conductive pattern prepared can be reduced, and ultraviolet rays during exposure can be smoothly transmitted through the film so that fine patterning becomes easy. When the volume average particle size is 10 µm or less, surface smoothness, pattern accuracy and dimensional accuracy of a circuit pattern after printing are improved. The volume average particle size can be determined by the Coulter counter method.

The added amount of the conductive filler (E) is preferably 70 to 95% by weight, more preferably 80 to 90% by weight based on the total solid content in the photosensitive conductive paste. When the added amount of the conductive filler (E) is 70% by weight or more, the probability of contact between conductive fillers particularly in setting shrinkage during curing is improved, the specific resistivity and breakage probability of the conductive pattern prepared can be reduced. When the added amount of the conductive filler (E) is 95% by weight or less, ultraviolet rays particularly during exposure can be smoothly transmitted through the film, so that fine patterning becomes easy. The photosensitive conductive paste may contain a solvent. Examples of the solvent include N,N-dimethylacetamide, N,N-dimethylformamide, N-methyl-2-pyrrolidone, dimethyl imidazolidinone, dimethyl sulfoxide, diethylene glycol monoethyl ether, diethylene glycol monoethyl ether acetate, γ-butyrolactone, ethyl lactate, 1-methoxy-2-propanol, 1-ethoxy-2-propanol, ethylene glycol mono-n-propyl ether, diacetone alcohol, tetrahydrofurfuryl alcohol and propylene glycol monomethyl ether acetate. One solvent may be used, or two or more solvents may be mixed and used. The solvent may be added for adjustment of the viscosity after preparation of the paste.

The photosensitive conductive paste may contain additives such as a non-photosensitive polymer having no unsaturated double bond in the molecule, a plasticizer, a leveling agent, a surfactant, a silane coupling agent, an antifoaming agent and a pigment as long as its desired characteristics are not impaired. Specific examples of the non-photosensitive polymer include epoxy resins, novolac resins, phenol resins, polyimide precursors and ring-closed polyimides.

Specific examples of the plasticizer include dibutyl phthalate, dioctyl phthalate, polyethylene glycol and glycerin. Specific examples of the leveling agent include special vinyl-based polymers and special acryl-based polymers.

Examples of the silane coupling agent include methyltrimethoxysilane, dimethyldiethoxysilane, phenyltriethoxysilane, hexamethyldisilazane, 3-methacryloxypropyltrimethoxysilane, 3-glycidoxypropyltrimethoxysilane and vinyltrimethoxysilane.

The photosensitive conductive paste is prepared using a disperser, a kneader or the like. Specific examples thereof include, but are not limited to, a three-roll roller, a ball mill and a planetary ball mill.

A method of producing a conductive pattern using the photosensitive conductive paste will now be described. To prepare a conductive pattern, the paste is applied onto a substrate, and dried by heating the paste to volatilize a solvent. Thereafter, a desired pattern is formed on the substrate by passing through a development step with the paste exposed via a pattern forming mask. Then, the pattern is cured at a temperature of 100° C. to 300° C. (inclusive) to prepare a conductive pattern. The curing temperature is preferably 120 to 180° C. When the heating temperature is lower than 100° C., the volume shrinkage amount of a resin can not be increased, and the specific resistivity cannot be reduced. On the other hand, the heating temperature is higher than 300° C., the photosensitive conductive paste can not be used on a substrate having low heat resistance, and cannot be used in combination with a material having low heat resistance.

Examples of the substrate include, but are not limited to, polyethylene terephthalate films (hereinafter, referred to as PET films), polyimide films, polyester films, aramid films, epoxy resin substrates, polyether imide resin substrates, polyether ketone resin substrates, polysulfone-based resin substrates, glass substrates, silicon wafers, alumina substrates, aluminum nitride substrates, silicon carbide substrates, decorated layer-formed substrates and insulating layer-formed substrates.

Examples of the method of applying the photosensitive conductive paste on the substrate include spin coating by a spinner, spray coating, roll coating, screen printing, blade coaters, die coaters, calender coaters, meniscus coaters and bar coaters. The coating film thickness varies depending on a coating method, a solid concentration of the composition, a viscosity and the like, but the paste is normally applied such that the film thickness after drying is 0.1 to 50 µm.

Next, a solvent is removed from the coating film applied onto the substrate. Examples of the method for removing a solvent include heating/drying by an oven, a hot plate, an infrared ray or the like and vacuum drying. Preferably, heating/drying is performed at a temperature of 50° C. to 180° C. for 1 minute to several hours.

The coating film after removal of the solvent is pattern-processed by a photolithography method. The light source to be used for exposure is preferably the i ray (365 nm), the h ray (405 nm) or the g ray (436 nm) of a mercury lamp.

After exposure, a desired pattern is obtained by removing an unexposed part using a developer. As a developer to be used for alkali development, an aqueous solution of a compound such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, hexamethylenediamine or the like is preferred. In some cases, a liquid obtained by adding to the aforementioned aqueous solution one or more of polar solvents such as N-methyl-2-pyrrolidone, N,N-dimethylformamide, N,N-dimethylacetamide, dimethyl sulfoxide and γ-butyrolactone, alcohols such as methanol, ethanol and isopropanol, esters such as ethyl lactate and propylene glycol monomethyl ether acetate, and ketones such as cyclopentanone, cyclohexanone, isobutyl ketone and methyl isobutyl ketone may be used as a developer. A liquid obtained by adding a surfactant to the above-mentioned aqueous alkali solution may also be used as a developer. As a developer to be used for organic development, a polar solvent such as N-methyl-2-pyrrolidone, N-acetyl-2-pyrrolidone, N,N-dimethylacetamide, N,N-dimethylformamide, dimethyl sulfoxide or hexamethylphosphortriamide alone, or a mixed solution with the polar solvent combined with methanol, ethanol, isopropyl alcohol, xylene, water, methyl carbitol, ethyl carbitol or the like may be used.

Development can be performed by a method in which the developer is sprayed to a coating film surface while a substrate is left at rest or rotated, or a substrate is immersed in a developer, or a substrate is immersed while an ultrasonic wave is applied thereto.

After development, a rinsing treatment with water may be performed. The rinsing treatment may be performed with an alcohol such as ethanol or isopropyl alcohol or an ester such as ethyl lactate or propylene glycol monomethyl ether acetate added to water.

Next, the paste composition film is cured for exhibiting conductivity. Examples of the method for curing the paste composition film include heating/drying by an oven, an inert oven, a hot plate, an infrared ray or the like and vacuum drying. In this way, a conductive pattern can be prepared by passing through a curing step.

A conductive pattern produced using the photosensitive conductive paste is suitably used as peripheral wiring for a touch panel. Examples of the type of touch panel include a resistive film type, an optical type, an electromagnetic induction type and an electrostatic capacitance type, and the conductive pattern produced using the photosensitive conductive paste of the present invention is more suitably used in the electrostatic capacitance type touch panel because this type of touch panel requires particularly fine wiring.

EXAMPLES

Examples will be described below, but this disclosure is not limited to these examples. Materials and evaluation methods used in examples and comparative examples are as follows.
Method of Evaluating Patterning Characteristics A photosensitive conductive paste was applied onto a PET film so as to have a dry thickness of 7 µm, dried in a drying oven at 100° C. for 5 minutes, exposed via a photomask having a light transmission pattern having nine units having different L/S values, with one unit including a group of lines arranged with a fixed line-and-space (L/S), developed and then cured in a drying oven at 140° C. for 30 minutes to obtain a conductive pattern. The L/S values of the units were set to 500/500, 250/250, 100/100, 50/50 and 40/40, 30/30, 25/25, 20/20 and 15/15 (each showing a line width (µm)/interval (µm)). The pattern was observed with an optical microscope to confirm a pattern which was free from residues between patterns and free from pattern peeling and had the smallest L/S value, and the smallest L/S value was defined as a development-enabling L/S.
Method of Evaluating Specific Resistivity A photosensitive conductive paste was dried in a drying oven at 100° C. for 5 minutes, exposed via a photomask having a light transmission part A with a pattern shown in FIG. 1, developed, and then cured in a drying oven at 140° C. for 30 minutes to obtain a conductive pattern for specific resistivity measurement. The conductive pattern has a line width of 0.400 mm and a line length of 80 mm. Ends of the obtained pattern were connected through a surface resistance meter to measure a surface resistance value, and a specific resistivity was calculated by fitting the measured value in the following calculation formula.

$$\text{Specific resistivity} = \text{surface resistance value} \times \text{film thickness} \times \text{line width} / \text{line length}$$

The film thickness was measured using a probe type step profiler: SURFCOM (registered trademark) 1400 (manufactured by TOKYO SEIMITSU CO., LTD.). The film thickness was measured at randomly selected three positions, and an average value of the thicknesses at the three positions was defined as a film thickness. The wavelength was 1 mm, and the scanning speed was 0.3 mm/sec. For the line width, an average value of line widths at three positions obtained by observing the pattern at the randomly selected three positions with an optical microscope and analyzing the image data was defined as a line width.

Method of Evaluating Flexibility

Figure 2:
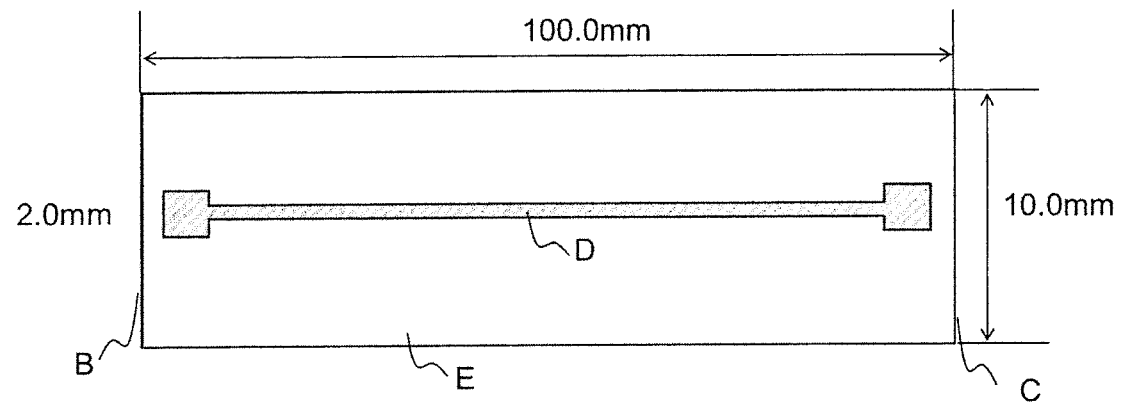
FIG. 2 is a schematic view of a sample used in a flexibility test in examples.

FIG. 2 is a view schematically showing a sample used in a flexibility test. A photosensitive conductive paste was applied onto a rectangular PET film (thickness: 40 μm) with a length of 10 mm and a width of 100 mm so as to have a dry thickness of 7 μm, dried in a drying oven at 100° C. for 5 minutes, and exposed while a photomask having a light transmission part A with a pattern shown in FIG. 1 was disposed such that the light transmission part was situated at the center of the sample, and the photosensitive conductive paste was developed and then cured in a drying oven at 140° C. for 30 minutes to form a conductive pattern. A resistance value was measured using a tester. Thereafter, a bending operation of bringing a sample short side B and a sample short side C into contact with each other with the sample bent to situate the conductive pattern at the inner side and the outer side alternately and returning the sample to its original state was repeated 100 times, followed by measuring a resistance value again by the tester. Rating "good" was assigned when the amount of change in resistance value was 20% or less as a result of the measurement, and cracking, peeling and line breakage etc. did not occur in the conductive pattern, and rating "poor" was assigned otherwise.

Method of Evaluating Adhesion to ITO

A photosensitive conductive paste was applied onto a PET film with ITO "ELECRYSTA" (registered trademark) V270L-TFS (manufactured by NITTO DENKO CORPORATION) to have a dry thickness of 7 μm, dried in a drying oven at 100° C. for 5 minutes, exposed over the entire printing surface, and then cured in a drying oven at 140° C. for 30 minutes, a cut was then made in the form of 10×10 squares with a width of 1 mm, and the sample was placed in a thermo-hygrostat bath SH-661 (manufactured by ESPEC Corp.) at 85° C. and 85% RH for 240 hours. Thereafter, the sample was taken out, a tape was attached at the location of the squares and peeled off, and assessment was performed with a number of remaining squares. A cellophane tape (manufactured by NICHIBAN CO., LTD.) was used as the tape.

Dicarboxylic Acid or Acid Anhydride Thereof (A)
Adipic acid
2-propylsuccinic acid
3-hexylpentanedioic acid
(E)-2-(hexa-4-ethyl)succinic acid
2-hexylpentanedioic acid
2-hexylmalonic acid
2-(3-ethoxypropyl)succinic acid
2-(3-ethoxybutyl)succinic acid
(E)-2-(hexa-1-enyl)succinic acid Compound (B) Having an Acid Value Falling within a Range of 40 to 200 Mg KOH/g Synthesis Example 1

Compound (B-1) Having an Acid Value Falling within a Range of 40 to 200 Mg KOH/g Copolymerization ratio (weight basis): ethyl acrylate (hereinafter, referred to as EA)/2-ethylhexyl methacrylate (hereinafter, referred to as 2-EHMA)/styrene (hereinafter, referred to as St)/glycidyl methacrylate (hereinafter, referred to as GMA)/acrylic acid (hereinafter, referred to as AA)=20/40/20/5/15.

Diethylene glycol monoethyl ether acetate (150 g) was added in a reaction vessel in a nitrogen atmosphere, and the temperature was elevated to 80° C. using an oil bath. To this was added dropwise for 1 hour a mixture including EA (20 g), 2-EHMA (40 g), St (20 g), AA (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether (1 g) was added to stop the polymerization reaction. Subsequently, a mixture including GMA (5 g), triethyl benzyl ammonium chloride (1 g) and diethylene glycol monoethyl ether acetate (10 g) was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a compound (B-1). The obtained compound (B-1) had an acid value of 103 mg KOH/g and a glass transition temperature of 21.7° C. as determined from numerical formula (1).

Synthesis Example 2

Compound (B-2) Having an Acid Value Falling within a Range of 40 to 200 Mg KOH/g Copolymerization ratio (weight basis): tricyclodecanedimethanol diacrylate (product name: IRR214-K; manufactured by DAICEL-CYTEC LTD.)/modified bisphenol A diacrylate (product name: EBECRYL 150; manufactured by DAICEL-CYTEC LTD.)/St/AA)=25/40/20/15.

Diethylene glycol monoethyl ether acetate (150 g) was added in a reaction vessel in a nitrogen atmosphere, and the temperature was elevated to 80° C. using an oil bath. To this was added dropwise for 1 hour a mixture including IRR214-K (25 g), EBECRYL 150 (40 g), St (20 g), AA (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether (1 g) was added to stop the polymerization reaction. The obtained reaction solution was refined with methanol to remove unreacted impurities, and dried under vacuum for 24 hours to obtain a compound (B-2). The obtained compound (B-2) had an acid value of 89 mg KOH/g and a glass transition temperature of 78.4° C. as determined from DSC measurement.

Synthesis Example 3

Compound (B-3) Having an Acid Value Falling within a Range of 40 to 200 Mg KOH/g Copolymerization ratio (weight basis): neopentyl glycol diacrylate (product name: Light Acrylate NP-A; manufactured by KYOEISHA CHEMICAL Co., Ltd.)/modified bisphenol A diacrylate (product name: EBECRYL 150; manufactured by DAICEL-CYTEC LTD.)/St/AA)=25/40/20/15.

Diethylene glycol monoethyl ether acetate (150 g) was added in a reaction vessel in a nitrogen atmosphere, and the temperature was elevated to 80° C. using an oil bath. To this was added dropwise for 1 hour a mixture including Light Acrylate NP-A (25 g), EBECRYL 150 (40 g), St (20 g), AA (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether ether (1 g) was added to stop the polymerization reaction. The obtained reaction solution was refined with methanol to remove unreacted impurities, and dried under vacuum for 24 hours to obtain a compound (B-3). The obtained compound (B-3) had an acid value of 84 mg KOH/g and a glass transition temperature of 52.3° C. as determined from DSC measurement.

Synthesis Example 4

Compound (B-4) Having an Acid Value Falling within a Range of 40 to 200 Mg KOH/g Copolymerization ratio (weight basis): ethylene oxide-modified bisphenol A diacrylate (product name: FA-324A; manufactured by Hitachi Chemical Co., Ltd.)/EA/GMA/AA=50/10/5/15.

Diethylene glycol monoethyl ether acetate (150 g) was added in a reaction vessel in a nitrogen atmosphere, and the temperature was elevated to 80° C. using an oil bath. To this was added dropwise for 1 hour a mixture including ethylene oxide-modified bisphenol A diacrylate FA-324A (50 g), EA (20 g), AA (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether (1 g) was added to stop the polymerization reaction. Subsequently, a mixture including GMA (5 g), triethyl benzyl ammonium chloride (1 g) and diethylene glycol monoethyl ether acetate (10 g) was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a compound (B-4). The obtained compound (B-4) had an acid value of 96 mg KOH/g and a glass transition temperature of 19.9° C. as determined from the numerical formula (1).

Synthesis Example 5

Compound Having an Acid Value Falling within a Range of 40 to 200 Mg KOH/g: Epoxy Acrylate (B-5)

Copolymerization ratio (weight basis): difunctional epoxy acrylate monomer (product name: Epoxy Ester 70PA; manufactured by KYOEISHA CHEMICAL Co., Ltd.)/modified bisphenol A diacrylate (product name: EBECRYL 150; manufactured by DAICEL-CYTEC LTD.)/St/AA)=25/40/20/15.

Diethylene glycol monoethyl ether acetate (150 g) was added in a reaction vessel in a nitrogen atmosphere, and the temperature was elevated to 80° C. using an oil bath. To this was added dropwise for 1 hour a mixture including Epoxy Ester 70PA (25 g), EBECRYL 150 (40 g), St (20 g), AA (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether (1 g) was added to stop the polymerization reaction. The obtained reaction solution was refined with methanol to remove unreacted impurities, and dried under vacuum for 24 hours to obtain a compound (B-5). The obtained compound (B-5) had an acid value of 88 mg KOH/g and a glass transition temperature of 58.1° C. as determined from DSC measurement.

Synthesis Example 6

Compound Having an Acid Value Falling within a Range of 40 to 200 Mg KOH/g: Epoxy Acrylate (B-6)

Copolymerization ratio (weight basis): Bifunctional epoxy acrylate monomer (product name: Epoxy Ester 3002A; manufactured by KYOEISHA CHEMICAL Co., Ltd.)/difunctional epoxy acrylate monomer (product name: Epoxy Ester 70PA; manufactured by KYOEISHA CHEMICAL Co., Ltd.)/St/AA)=25/40/20/15.

Diethylene glycol monoethyl ether acetate (150 g) was added in a reaction vessel in a nitrogen atmosphere, and the temperature was elevated to 80° C. using an oil bath. To this was added dropwise for 1 hour a mixture including Epoxy Ester 3002A (25 g), Epoxy Ester 70PA (40 g), St (20 g), AA (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether (1 g) was added to stop the polymerization reaction. The obtained reaction solution was refined with methanol to remove unreacted impurities, and dried under vacuum for 24 hours to obtain a compound (B-6). The obtained compound (B-6) had an acid value of 90 mg KOH/g and a glass transition temperature of 78.1° C. as determined from DSC measurement.

Synthesis Example 7

Compound Having an Acid Value Falling within a Range of 40 to 200 Mg KOH/g: Epoxy Acrylate (B-7)

Copolymerization ratio (weight basis): difunctional epoxy acrylate monomer (product name: Epoxy Ester 3002A; manufactured by KYOEISHA CHEMICAL Co., Ltd.)/difunctional epoxy acrylate monomer (product name: Epoxy Ester 70PA; manufactured by KYOEISHA CHEMICAL Co., Ltd.)/GMA/St/AA)=20/40/5/20/15.

Diethylene glycol monoethyl ether acetate (150 g) was added in a reaction vessel in a nitrogen atmosphere, and the temperature was elevated to 80° C. using an oil bath. To this was added dropwise for 1 hour a mixture including Epoxy Ester 3002A (20 g), Epoxy Ester 70PA (40 g), St (20 g), AA (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether (1 g) was added to stop the polymerization reaction. Subsequently, a mixture including GMA (5 g), triethyl benzyl ammonium chloride (1 g) and diethylene glycol monoethyl ether acetate (10 g) was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a compound (B-7). The obtained compound (B-7) had an acid value of 101 mg KOH/g and a glass transition temperature of 80.4° C. as determined from DSC measurement.

Synthesis Example 8

Compound Having an Acid Value Falling within a Range of 40 to 200 Mg KOH/g: Epoxy Acrylate (B-8)

Copolymerization ratio (weight basis): difunctional epoxy acrylate monomer (product name: Epoxy Ester 80MFA;

manufactured by KYOEISHA CHEMICAL Co., Ltd.)/tricyclodecanedimethanol diacrylate (product name: IRR214-K; manufactured by DAICEL-CYTEC LTD.)/GMA/St/AA)= 20/40/5/20/15.

Diethylene glycol monoethyl ether acetate (150 g) was added in a reaction vessel in a nitrogen atmosphere, and the temperature was elevated to 80° C. using an oil bath. To this was added dropwise for 1 hour a mixture including Epoxy Ester 80MFA (20 g), IRR214-K (40 g), St (20 g), AA (15 g), 2,2'-azobisisobutyronitrile (0.8 g) and diethylene glycol monoethyl ether acetate (10 g). After completion of the dropwise addition, further a polymerization reaction was carried out for 6 hours. Thereafter, hydroquinone monomethyl ether (1 g) was added to stop the polymerization reaction. Subsequently, a mixture including GMA (5 g), triethyl benzyl ammonium chloride (1 g) and diethylene glycol monoethyl ether acetate (10 g) was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a compound (B-8). The obtained compound (B-8) had an acid value of 104 mg KOH/g and a glass transition temperature of 45.4° C. as determined from DSC measurement.

Alicyclic Compound (C)
Hydrogenated bisphenol A
1,1-cyclobutanedicarboxylic acid
Trans-4-methylcyclohexyl isocyanate
PO adduct diacrylate of hydrogenated bisphenol A
RIKARESIN (registered trademark) HBE-100 (polymer of 4,4'-isopropylidenedicyclohexanol and (chloromethyl)oxirane (manufactured by New Japan Chemical Co., Ltd.)
Photopolymerization Initiator (D)
IRGACURE (registered trademark) 369 (manufactured by Ciba Japan K.K.)
Conductive Filler (E)

One having the material and the volume average particle size described in Table 1 was used. The volume average particle size was determined by the following method.
Measurement of Average Particle Size The average particle size of the conductive filler (E) was determined by measuring a volume average particle size using a dynamic light scattering particle size distribution meter manufactured by HORIBA, Ltd.
Monomer Light Acrylate BP-4EA (manufactured by KYOEISHA CHEMICAL Co., LTD.)
Solvent Diethylene glycol monoethyl ether acetate (manufactured by Tokyo Chemical Industry Co., Ltd.)

Example 1

Adipic acid (0.50 g), the compound (B-1) (10.0 g), a photopolymerization initiator IRGACURE 369 (0.50 g) (manufactured by Ciba Japan K.K.), hydrogenated bisphenol A (0.5 g) and diethylene glycol monoethyl ether acetate (5.0 g) were added in a 100 mL clean bottle, and mixed by "Awatori Rentaro" (registered trademark) ARE-310 (manufactured by THINKY CORPORATION) to obtain a photosensitive resin solution (16.5 g) (solid content: 69.7% by weight).

The obtained photosensitive resin solution (16.5 g) and Ag particles having an average particle size of 2 μm (72.0 g) were mixed together, and the mixture was kneaded using a three-roll roller "EXAKT M-50" (manufactured by EXAKT) to obtain a photosensitive conductive paste (88.5 g).

The obtained paste was applied onto a PET film having a film thickness of 100 μm by screen printing, and dried in a drying oven at 80° C. for 10 minutes. Thereafter, the paste was exposed over the entire line at an exposure amount of 150 mJ/cm$^2$ (in terms of a wavelength of 365 nm) using exposure equipment "PEM-6M" (manufactured by UNION OPTICAL CO., LTD.), subjected to immersion development with a 0.25% $Na_2CO_3$ solution for 30 seconds, and rinsed with ultrapure water, and then cured in a drying oven at 140° C. for 30 minutes. The pattern-processed conductive pattern had a film thickness of 7 μm. The line-and-space (L/S) pattern of the conductive pattern was observed with an optical microscope to confirm that the conductive pattern was satisfactorily pattern-processed with no residue between patterns and no pattern peeling when the L/S was 20/20 μm or less. The specific resistivity of the conductive pattern was measured to be 4.4× $10^{-5}$ Ωcm. For flexibility, cracking and line breakage did not occur after the test, and good results were obtained.

Examples 2 to 22

Photosensitive conductive pastes having the compositions shown in Tables 1 to 3 were produced in the same manner as in Example 1. Evaluation results are shown in Table 4.

Comparative Examples 1 and 2

Photosensitive conductive pastes having the compositions shown in Table 3 were produced in the same manner as in Example 1. Evaluation results are shown in Table 4.

In Examples 1 to 22 which satisfy our requirements, a pattern having a high resolution could be formed, and a conductive pattern having low resistivity could be obtained by curing at 140° C., but in Comparative Examples 1 and 2 where the compound (C) was not used, adhesion to ITO was reduced under a high temperature and high humidity.

TABLE 1

| | Dicarboxylic acid or acid anhydride thereof (A) | | Photosensitive component (B) | Alicyclic compound (C) | | Photopolymerization initiator (D) | |
|---|---|---|---|---|---|---|---|
| | Type | Added amount based on 100 parts by weight of photosensitive component (B) (parts by weight) | Type | Type | Added amount based on 100 parts by weight of photosensitive component (B) (parts by weight) | Type | Added amount based on 100 parts by weight of photosensitive component (B) (parts by weight) |
| Example 1 | Adipic acid | 5 | B-1 | Hydrogenated bisphenol A | 5 | "IRGACURE" 369 | 5 |
| Example 2 | Adipic acid | 5 | B-1 | 1,1-cyclobutane-dicarboxylic acid | 5 | "IRGACURE" 369 | 5 |

TABLE 1-continued

| | Dicarboxylic acid or acid anhydride thereof (A) Type | Added amount based on 100 parts by weight of photosensitive component (B) (parts by weight) | Photosensitive component (B) Type | Alicyclic compound (C) Type | Added amount based on 100 parts by weight of photosensitive component (B) (parts by weight) | Photopolymerization initiator (D) Type | Added amount based on 100 parts by weight of photosensitive component (B) (parts by weight) |
|---|---|---|---|---|---|---|---|
| Example 3 | (E)-2-(hexa-4-ethyl) succinic acid | 5 | B-2 | PO adduct diacrylate of hydrogenated bisphenol A | 5 | "IRGACURE" 369 | 5 |
| Example 4 | 2-propyl-succinic acid | 5 | B-2 | "RIKARESIN" HBE-100 | 5 | "IRGACURE" 369 | 5 |
| Example 5 | 3-hexylpen-tanedioic acid | 5 | B-3 | PO adduct diacrylate of hydrogenated bisphenol A | 5 | "IRGACURE" 369 | 5 |
| Example 6 | 2-hexyl-malonic acid | 5 | B-3 | "RIKARESIN" HBE-100 | 5 | "IRGACURE" 369 | 5 |
| Example 7 | 2-propyl-succinic acid | 5 | B-4 | Hydrogenated bisphenol A | 5 | "IRGACURE" 369 | 5 |
| Example 8 | 2-propyl-succinic acid | 5 | B-4 | 1,1-cyclobutane-dicarboxylic acid | 5 | "IRGACURE" 369 | 5 |

| | Conductive filler (E) Content in paste (% by mass) | Type | Average particle size (µm) | Monomer Type | Added amount based on 100 parts by weight of photosensitive component (B) (parts by weight) | Solvent Type | Added amount based on 100 parts by weight of photosensitive component (B) (parts by weight) |
|---|---|---|---|---|---|---|---|
| Example 1 | 87 | Ag | 2.0 | — | — | Diethylene glycol monoethyl ether acetate | 50 |
| Example 2 | 87 | Ag | 2.0 | BP-4EA | 20 | Diethylene glycol monoethyl ether acetate | 50 |
| Example 3 | 87 | Ag | 2.0 | BP-4EA | 20 | Diethylene glycol monoethyl ether acetate | 50 |
| Example 4 | 87 | Ag | 2.0 | BP-4EA | 20 | Diethylene glycol monoethyl ether acetate | 50 |
| Example 5 | 87 | Ag | 2.0 | BP-4EA | 20 | Diethylene glycol monoethyl ether acetate | 50 |
| Example 6 | 87 | Ag | 2.0 | BP-4EA | 20 | Diethylene glycol monoethyl ether acetate | 50 |
| Example 7 | 87 | Ag | 2.0 | BP-4EA | 20 | Diethylene glycol monoethyl ether acetate | 50 |
| Example 8 | 87 | Ag | 2.0 | BP-4EA | 20 | Diethylene glycol monoethyl ether acetate | 50 |

TABLE 2

| | Dicarboxylic acid or acid anhydride thereof (A) Type | Added amount based on 100 parts by weight of photosensitive component (B) (parts by weight) | Photosensitive component (B) Type | Alicyclic compound (C) Type | Added amount based on 100 parts by weight of photosensitive component (B) (parts by weight) | Photopolymerization initiator (D) Type | Added amount based on 100 parts by weight of photosensitive component (B) (parts by weight) |
|---|---|---|---|---|---|---|---|
| Example 9 | 3-Hexylpen-tanedioic acid | 5 | B-4 | Trans-4 methylcyclohexyl isocyanate | 5 | "IRGACURE" 359 | 5 |
| Example 10 | 3-Hexylpen-tanedioic acid | 5 | B-4 | PO adduct diacrylate of hydrogenated bisphenol A | 5 | "IRGACURE" 369 | 5 |

TABLE 2-continued

| | | | | | | | |
|---|---|---|---|---|---|---|---|
| Example 11 | (E)-2-(hexa-4-ethyl) succinic acid | 5 | B-4 | "RIKARESIN" HBE-100 | 5 | "IRGACURE" 369 | 5 |
| Example 12 | 2-Hexylpentanedioic acid | 5 | B-4 | "RIKARESIN" HBE-100 | 5 | "IRGACURE" 369 | 5 |
| Example 13 | 2-Hexyl-malonic acid | 5 | B-4 | PO adduct diacrylate of hydrogenated bisphenol A | 5 | "IRGACURE" 369 | 5 |
| Example 14 | 2-(3-Ethoxy-propyl) succinic acid | 5 | B-4 | Trans-4-methylcyclohexyl isocyanate | 5 | "IRGACURE" 369 | 5 |
| Example 15 | 2-Propyl-succinic acid | 5 | B-5 | PO adduct diacrylate of hydrogenated bisphenol A | 5 | "IRGACURE" 369 | 5 |
| Example 16 | 2-(3-Ethoxy-propyl) succinic acid | 5 | B-5 | "RIKARESIN" HBE-100 | 5 | "IRGACURE" 369 | 5 |

| | Conductive filler (E) | | Monomer | | Solvent | |
|---|---|---|---|---|---|---|
| | Content in paste (% by mass) | Type | Average particle size (μm) | Type | Added amount based on 100 parts by weight of photosensitive component (B) (parts by weight) | Type | Added amount based on 100 parts by weight of photosensitive component (B) (parts by weight) |
| Example 9 | 87 | Ag | 2.0 | — | — | Diethylene glycol monoethyl ether acetate | 50 |
| Example 10 | 87 | Ag | 2.0 | BP-4EA | 20 | Diethylene glycol monoethyl ether acetate | 50 |
| Example 11 | 87 | Ag | 2.0 | — | — | Diethylene glycol monoethyl ether acetate | 50 |
| Example 12 | 87 | Ag | 2.0 | BP-4EA | 20 | Diethylene glycol monoethyl ether acetate | 50 |
| Example 13 | 87 | Ag | 2.0 | BP-4EA | 20 | Diethylene glycol monoethyl ether acetate | 50 |
| Example 14 | 87 | Ag | 2.0 | — | — | Diethylene glycol monoethyl ether acetate | 50 |
| Example 15 | 87 | Ag | 2.0 | BP-4EA | 20 | Diethylene glycol monoethyl ether acetate | 50 |
| Example 16 | 87 | Ag | 2.0 | BP-4EA | 20 | Diethylene glycol monoethyl ether acetate | 50 |

TABLE 3

| | Dicarboxylic acid or acid anhydride thereof (A) | | Photosensitive component (B) | Alicyclic compound (C) | | Photopolymerization initiator (D) | |
|---|---|---|---|---|---|---|---|
| | Type | Added amount based on 100 parts by weight of photosensitive component (B) (parts by weight) | Type | Type | Added amount based on 100 parts by weight of photosensitive component (B) (parts by weight) | Type | Added amount based on 100 parts by weight of photosensitive component (B) (parts by weight) |
| Example 17 | 2-Hexylpentanedioic acid | 5 | B-6 | Trans-4-methylcyclohexyl isocyanate | 5 | "IRGACURE" 369 | 5 |
| Example 18 | 2-Propyl-succinic acid | 5 | B-6 | "RIKARESIN" HBE-100 | 5 | "IRGACURE" 369 | 5 |

TABLE 3-continued

| | | | | | | | |
|---|---|---|---|---|---|---|---|
| Example 19 | 2-Hexyl-malonic acid | 5 | B-7 | PO adduct diacrylate of hydrogenated bisphenol A | 5 | "IRGACURE" 363 | 5 |
| Example 20 | (E)-2-(hexa-4-ethyl) succinic acid | 5 | B-7 | Trans-4-methylcyclohexyl isocyanate | 5 | "IRGACURE" 369 | 5 |
| Example 21 | 2-(3-Ethoxy-propyl) succinic acid | 5 | B-8 | PO adduct diacrylate of hydrogenated bisphenol A | 5 | "IRGACURE" 369 | 5 |
| Example 22 | 3-Hexylpen-tanedioic acid | 5 | B-8 | "RIKARESIN" HBE-100 | 5 | "IRGACURE" 369 | 5 |
| Comparative Example 1 | — | — | B-1 | — | — | "IRGACURE" 369 | 5 |
| Comparative Example 2 | 2-Propyl-succinic acid | 5 | B-4 | — | — | "IRGACURE" 369 | 5 |

| | Conductive filler (E) | | | Monomer | | Solvent | |
|---|---|---|---|---|---|---|---|
| | Content in paste (% by mass) | Type | Average particle size (μm) | Type | Added amount based on 100 parts by weight of photosensitive component (B) (parts by weight) | Type | Added amount based on 100 parts by weight of photosensitive component (B) (parts by weight) |
| Example 17 | 87 | Ag | 2.0 | BP-4EA | 20 | Diethylene glycol monoethyl ether acetate | 50 |
| Example 18 | 87 | Ag | 2.0 | BP-4EA | 20 | Diethylene glycol monoethyl ether acetate | 50 |
| Example 19 | 87 | Ag | 2.0 | — | — | Diethylene glycol monoethyl ether acetate | 50 |
| Example 20 | 87 | Ag | 2.0 | — | — | Diethylene glycol monoethyl ether acetate | 50 |
| Example 21 | 87 | Ag | 2.0 | — | — | Diethylene glycol monoethyl ether acetate | 50 |
| Example 22 | 87 | Ag | 2.0 | — | — | Diethylene glycol monoethyl ether acetate | 50 |
| Comparative Example 1 | 87 | Ag | 2.0 | BP-4EA | 20 | Diethylene glycol monoethyl ether acetate | 50 |
| Comparative Example 2 | 87 | Ag | 2.0 | BP-4EA | 20 | Diethylene glycol monoethyl ether acetate | 50 |

TABLE 4

| | Preparation conditions | | Characteristics of conductive pattern | | | |
|---|---|---|---|---|---|---|
| | Substrate | Curing conditions | Development-enabling L/S (μm) | Specific resistivity (Ωcm) | Flexibility | Adhesion to ITO Number of remaining squares |
| Example 1 | PET film | 140° C. × 30 minutes | 20/20 | $4.4 \times 10^{-5}$ | good | 100 |
| Example 2 | PET film | 140° C. × 30 minutes | 20/20 | $5.3 \times 10^{-5}$ | good | 95 |
| Example 3 | PET film | 140° C. × 30 minutes | 20/20 | $4.3 \times 10^{-5}$ | good | 97 |
| Example 4 | PET film | 140° C. × 30 minutes | 20/20 | $5.8 \times 10^{-5}$ | good | 96 |
| Example 5 | PET film | 140° C. × 30 minutes | 20/20 | $6.1 \times 10^{-5}$ | good | 98 |
| Example 6 | PET film | 140° C. × 30 minutes | 20/20 | $5.2 \times 10^{-5}$ | good | 97 |
| Example 7 | PET film | 140° C. × 30 minutes | 20/20 | $5.5 \times 10^{-5}$ | good | 100 |
| Example 8 | PET film | 140° C. × 30 minutes | 20/20 | $6.2 \times 10^{-5}$ | good | 100 |
| Example 9 | PET film | 140° C. × 30 minutes | 20/20 | $4.8 \times 10^{-5}$ | good | 100 |
| Example 10 | PET film | 140° C. × 30 minutes | 20/20 | $5.1 \times 10^{-5}$ | good | 100 |
| Example 11 | PET film | 140° C. × 30 minutes | 20/20 | $5.2 \times 10^{-5}$ | good | 100 |

TABLE 4-continued

| | Preparation conditions | | Characteristics of conductive pattern | | | |
|---|---|---|---|---|---|---|
| | Substrate | Curing conditions | Development-enabling L/S (μm) | Specific resistivity (Ωcm) | Flexibility | Adhesion to ITO Number of remaining squares |
| Example 12 | PET film | 140° C. × 30 minutes | 20/20 | $7.5 \times 10^{-5}$ | good | 100 |
| Example 13 | PET film | 140° C. × 30 minutes | 20/20 | $5.8 \times 10^{-5}$ | good | 100 |
| Example 14 | PET film | 140° C. × 30 minutes | 20/20 | $5.4 \times 10^{-5}$ | good | 100 |
| Example 15 | PET film | 140° C. × 30 minutes | 20/20 | $6.8 \times 10^{-5}$ | good | 100 |
| Example 16 | PET film | 140° C. × 30 minutes | 20/20 | $7.1 \times 10^{-5}$ | good | 100 |
| Example 17 | PET film | 140° C. × 30 minutes | 20/20 | $5.3 \times 10^{-5}$ | good | 100 |
| Example 18 | PET film | 140° C. × 30 minutes | 20/20 | $7.7 \times 10^{-5}$ | good | 100 |
| Example 19 | PET film | 140° C. × 30 minutes | 20/20 | $5.4 \times 10^{-5}$ | good | 100 |
| Example 20 | PET film | 140° C. × 30 minutes | 20/20 | $5.3 \times 10^{-5}$ | good | 100 |
| Example 21 | PET film | 140° C. × 30 minutes | 20/20 | $5.3 \times 10^{-5}$ | good | 100 |
| Example 22 | PET film | 140° C. × 30 minutes | 20/20 | $7.1 \times 10^{-5}$ | good | 100 |
| Comparative Example 1 | PET film | 140° C. × 30 minutes | 20/20 | >1.0 | good | 25 |
| Comparative Example 2 | PET film | 140° C. × 30 minutes | 20/20 | $2.3 \times 10^{-2}$ | good | 43 |

INDUSTRIAL APPLICABILITY

There is the advantage that a conductive pattern having excellent adhesion to ITO and having a low specific resistivity even under low curing temperature conditions is obtained, and fine patterning is possible owing to high photosensitive characteristics. According to a preferred configuration, fine bumps, wiring or the like can be easily formed not only on a rigid substrate but also on a flexible substrate.

The invention claimed is:

1. A photosensitive conductive paste comprising: a dicarboxylic acid or an acid anhydride thereof (A); a compound (B) having an acid value of 40 to 200 mg KOH/g; an alicyclic compound (C); a photopolymerization initiator (D); and a conductive filler (E), wherein the alicyclic compound (C) has a hydrogenated bisphenol A backbone.

2. The photosensitive conductive paste according to claim 1, wherein the compound (B) has an unsaturated double bond.

3. The photosensitive conductive paste according to claim 2, wherein the dicarboxylic acid or an acid anhydride thereof (A) is a dicarboxylic acid represented by structural formula (1), or an acid anhydride thereof:

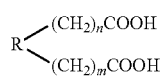

(1)

wherein R represents a divalent organic group with a carbon number of 1 to 30; and n and m each represent an integer of 0 to 3.

4. The photosensitive conductive paste according to claim 2, wherein the dicarboxylic acid or an acid anhydride thereof (A) is a dicarboxylic acid represented by structural formula (2), or an acid anhydride thereof:

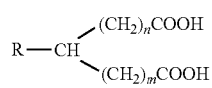

(2)

wherein R represents an organic group with a carbon number of 1 to 30; and n and m each represent an integer of 0 to 3.

5. The photosensitive conductive paste according to claim 2, wherein the alicyclic compound (C) contains any one of an unsaturated double bond, a hydroxyl group, a carboxyl group, an epoxy group, an amino group, an isocyanate group and an alkoxy group.

6. The photosensitive conductive paste according to claim 2, wherein the alicyclic compound (C) has a cyclohexane backbone.

7. The photosensitive conductive paste according to claim 1, wherein the dicarboxylic acid or an acid anhydride thereof (A) is a dicarboxylic acid represented by structural formula (1), or an acid anhydride thereof:

(1)

wherein R represents a divalent organic group with a carbon number of 1 to 30; and n and m each represent an integer of 0 to 3.

8. The photosensitive conductive paste according to claim 7, wherein the alicyclic compound (C) contains any one of an unsaturated double bond, a hydroxyl group, a carboxyl group, an epoxy group, an amino group, an isocyanate group and an alkoxy group.

9. The photosensitive conductive paste according to claim 7, wherein the alicyclic compound (C) has a cyclohexane backbone.

10. The photosensitive conductive paste according to claim 1, wherein the alicyclic compound (C) contains any one of an unsaturated double bond, a hydroxyl group, a carboxyl group, an epoxy group, an amino group, an isocyanate group and an alkoxy group.

11. The photosensitive conductive paste according to claim 1, wherein the alicyclic compound (C) has a cyclohexane backbone.

12. The photosensitive conductive paste according to claim 1, wherein the compound (B) having an acid value of 40 to 200 mg KOH/g is an epoxy acrylate.

13. The photosensitive conductive paste according to claim 1, wherein the compound (B) having an acid value of 40 to 200 mg KOH/g has a glass transition temperature of −10 to 50° C.

14. A method of producing a conductive pattern, wherein the photosensitive conductive paste set forth in claim 1 is applied onto a substrate, dried, exposed, developed, and then cured at a temperature of 100° C. to 300° C.

15. A touch panel comprising the conductive pattern set forth in claim 14.

16. A photosensitive conductive paste comprising: a dicarboxylic acid or an acid anhydride thereof (A); a compound (B) having an acid value of 40 to 200 mg KOH/g; an alicyclic compound (C); a photopolymerization initiator (D); and a conductive filler (E), wherein the dicarboxylic acid or an acid anhydride thereof (A) is a dicarboxylic acid represented by structural formula (2), or an acid anhydride thereof:

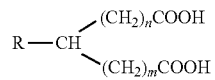

(2)

wherein R represents an organic group with a carbon number of 1 to 30; and n and m each represent an integer of 0 to 3.

17. The photosensitive conductive paste according to claim 16, wherein the alicyclic compound (C) contains any one of an unsaturated double bond, a hydroxyl group, a carboxyl group, an epoxy group, an amino group, an isocyanate group and an alkoxy group.

18. The photosensitive conductive paste according to claim 16, wherein the alicyclic compound (C) has a cyclohexane backbone.

* * * * *